United States Patent
Marrakchi et al.

(10) Patent No.: US 7,795,911 B2
(45) Date of Patent: Sep. 14, 2010

(54) PROGRAMMABLE GATE ARRAY, SWITCH BOX AND LOGIC UNIT FOR SUCH AN ARRAY

(75) Inventors: Zied Marrakchi, Paris (FR); Hayder Mrabet, Paris (FR); Habib Mehrez, Vitry sur Seine (FR)

(73) Assignees: Universite Pierre Et Marie Curie, Paris Cedex (FR); Centre National de la Recherche Scientifique, Paris (FR)

( * ) Notice: Subject to any disclaimer, the term of this patent is extended or adjusted under 35 U.S.C. 154(b) by 44 days.

(21) Appl. No.: 12/210,486

(22) Filed: Sep. 15, 2008

(65) Prior Publication Data

US 2010/0007378 A1     Jan. 14, 2010

(30) Foreign Application Priority Data

Jul. 9, 2008   (FR) ................................... 08 03903

(51) Int. Cl.
*H01L 25/00* (2006.01)
*H03K 19/177* (2006.01)

(52) U.S. Cl. .............................. 326/41; 326/39; 326/47

(58) Field of Classification Search ............. 326/38–41, 326/47

See application file for complete search history.

(56) References Cited

U.S. PATENT DOCUMENTS

| 5,255,203 A | 10/1993 | Agrawal et al. |
| 5,682,107 A | 10/1997 | Tavana et al. |
| 7,498,840 B2* | 3/2009 | LePape ........................ 326/41 |
| 2009/0072856 A1* | 3/2009 | Subramaniam et al. ........ 326/38 |
| 2009/0072858 A1* | 3/2009 | D'Souza et al. ................ 326/47 |

FOREIGN PATENT DOCUMENTS

EP       0 630 115       12/1994

* cited by examiner

*Primary Examiner*—Anh Q Tran
(74) *Attorney, Agent, or Firm*—Muncy, Geissler, Olds & Lowe, PLLC

(57) ABSTRACT

A switch box (2) for a programmable gate array including input ports grouping a plurality of inputs (I, I') and output ports grouping a plurality of outputs (O, O'), with the inputs and the outputs being connected to a downstream connection tree structure from the inputs toward the outputs and including routing elements (4, 5, 6) organized according to several levels for connecting by a single path each input of all the input ports to at least one output of each output port.

Switch boxes, logic units and programmable gate arrays including these, which are so arranged as to define a single path between two points of the array.

14 Claims, 4 Drawing Sheets

PROGRAMMABLE GATE ARRAY, SWITCH BOX AND LOGIC UNIT FOR SUCH AN ARRAY

The present description relates to a programmable gate array such as those known as FPGA for "Field Programmable Gate Array", a switch box and a logic unit for such an array.

BACKGROUND OF THE INVENTION

A programmable gate array is an integrated circuit which can be programmed by the manufacturer of devices integrating such a circuit, or by the user in order to adapt the circuit to the application which it is intended for. Such a programmable gate array can thus replace several integrated circuits specially designed for particular applications (or ASIC circuit for "Application Specific Integrated Circuit").

A programmable (or configurable) gate array includes programmable clusters and an interconnection matrix structure having nodes formed by programmable switch boxes. Clusters are connected to the interconnection matrix structure by connection units positioned between each pair of adjacent switch boxes. Such architecture makes it possible to create many information circulation paths between two points on the array, such paths being determined by algorithms. Thus, it is difficult to estimate the time required for transporting information from one point to another. In addition, such circuits have an important surface and use a lot of energy. Such circuits are thus little or not used when the power source is a battery.

OBJECT OF THE INVENTION

One aim of the invention is to provide means for obtaining a programmable gate array which is more compact while still being flexible and relatively performing, more particularly as regards the routing time.

SUMMARY OF THE INVENTION

For this purpose, the object of the invention is a switch box for a programmable gate array including input ports grouping a plurality of inputs and output ports grouping a plurality of outputs, the inputs and the outputs being connected to a downstream connection tree structure from the inputs to the outputs, including routing elements organized on several levels for connecting by a single path each input of all the input ports to at least one output of each output port.

Thus, the switch boxes offer many possible connections and are thus highly flexible. The connection tree structure and the existence of single routing paths make it possible to have a good estimation of the routing and routing time.

Preferably, in the switch box of the invention:
the output ports include output ports towards the neighboring switch boxes and output ports towards the neighboring logic units,
the input ports include input ports from the neighboring switch boxes and input ports from the neighboring logic units,
the routing elements include first routing elements positioned between the input ports from the neighboring switch boxes and the output ports toward the neighboring switch boxes; second routing elements positioned between, on the one hand, the input ports from the logic units and on the other hand the first routing elements and third routing elements, the third routing elements being positioned between, on the one hand, the first routing elements and the second routing elements and, on the other hand, the output ports towards the logic units.

In a particular embodiment:
the first routing elements have inputs connected each to one input of each input port from the neighboring switch boxes, at least one input being connected to one output of one of the second routing elements, outputs each connected to one output of each output port towards the neighboring switch boxes and output each connected to one input of the third routing elements;
the second routing elements each have input connected each to one of the inputs of each input port from the logic units and outputs each connected to the corresponding input of a part of the first routing elements into one of the inputs of a part of the third routing elements;
the third routing elements have inputs connected to the output of the first and second routing elements and outputs connected, each, to one of the output of each output port towards the logic units.

Another object of the invention is a logic unit for a programmable gate array, including clusters connected to input ports grouping a plurality of input and output ports grouping a plurality of outputs, the inputs, the outputs and the clusters being connected to a downstream connection tree structure from the input ports towards the clusters and upstream from the clusters towards the output ports, including incoming routing elements and outgoing routing elements organized on several levels, the incoming routing elements connecting by a single path each input of all the input ports to all the clusters and the outgoing routing elements connecting through a unique path each output of a logic bloc to all the output ports and to the incoming routing elements of the same group.

Preferably, each logic unit has L hierarchical levels which each include at least a group $G_n$ grouping at least:
$R_n$ inputs and $S_n$ outputs,
$Q_n$ groups $G_{n-1}$ belonging to the hierarchical level n−1, each having $R_{n-1}$ inputs and $S_{n-1}$ outputs,
$R_{n-1}$ incoming routing elements is connected each to all the $Q_n$ groups $G_{n-1}$,
$S_{n-1}$ outgoing routing elements connected to all the $Q_n$ groups $G_{n-1}$ and to an assembly of incoming routing elements of this group,
each group of the lowest level corresponding to a logic block.

The invention further relates to a programmable gate array including reconfigurable switch boxes and reconfigurable logic units connected together through a communication meshing such as:
each switch box is directly connected to four neighboring switch boxes,
each logic unit has eight neighboring logic units and is connected to each one of them through a switch box,
at least a single path is defined between two points on the array.

In the present description, two elements are "connected" together when an electric conduction is possible between both elements, such conductivity being actuated or deactivated depending whether it is used or not in the finally programmed configuration. Thus, the logic unit can be programmed for directly communicating with the neighboring logic unit, while using only one of the neighboring switches. Thus, it is possible to reduce the length of the paths between two points on the array. In addition, this makes it possible to increase the density of logic units and switch boxes.

Advantageously, the array includes switch boxes and/or logic units of the above mentioned types.

Such structure combines a meshed architecture outside the switch boxes and a tree structure in the switch boxes and the logic units, taking advantage of both architectures.

Other characteristics and advantages of the present invention will appear upon reading the following description of a non limitative specific embodiment of the invention.

BRIEF DESCRIPTION OF THE DRAWINGS

Reference will be made to the appended drawings, in which.

DETAILED DESCRIPTION OF THE INVENTION

Figure 1:
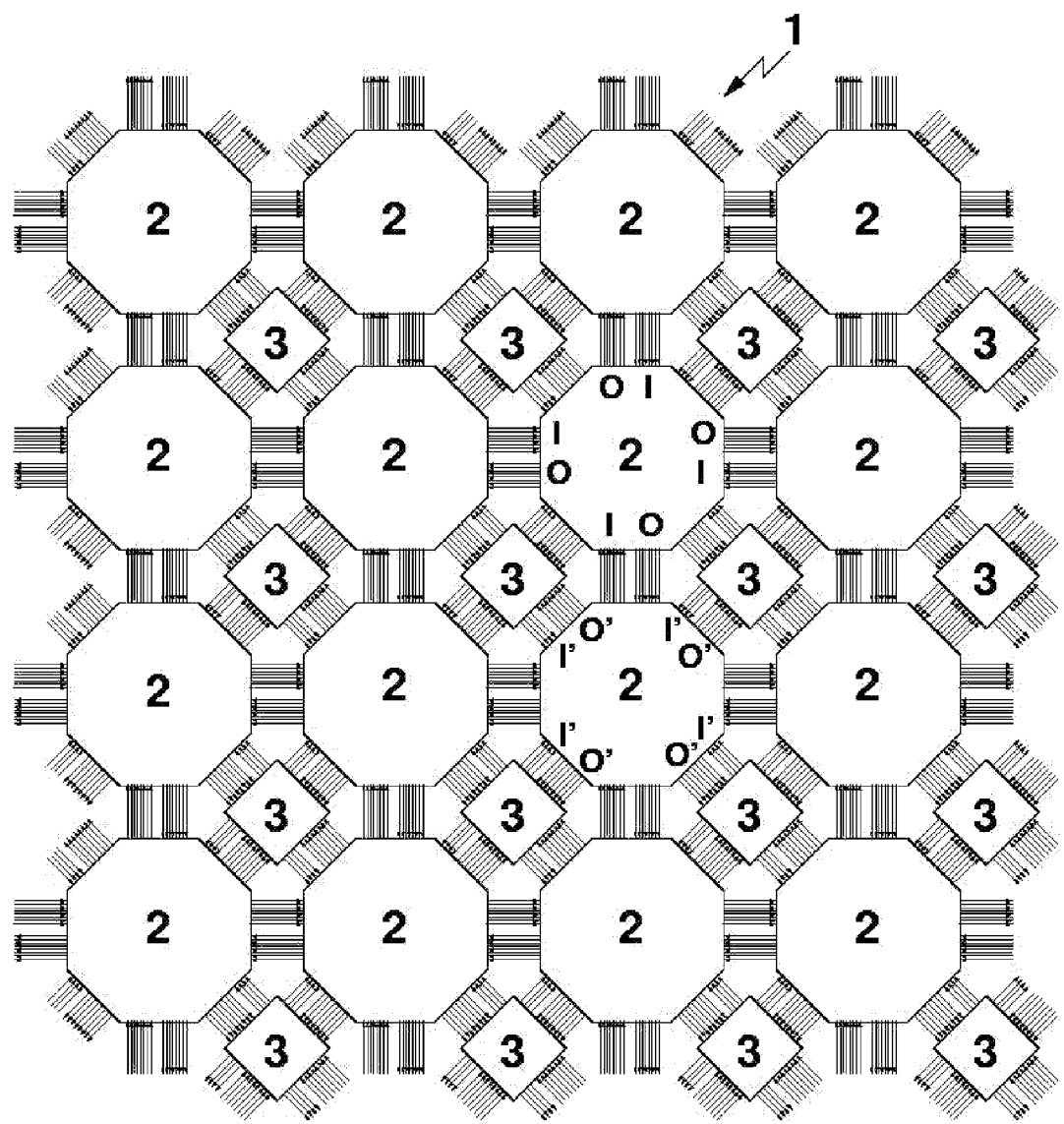
FIG. 1 is a partial schematic view of an array according to the invention.

In the following description:

switch box means a routing member positioned at the intersection of several channels and being programmable for directing the signals from some of the channels towards one or several of the other channels, such a routing member including several routing elements such as those defined hereinunder;

routing element means a programmable routing element for example of the "full crossbar" type positioned in a switch box or a logic unit for directing and transmitting signals within a switch box or the logic unit;

logic unit means a unique cluster or a plurality of clusters connected by routing elements, a processor or any other element likely to be programmed to perform one or several logic operations;

logic block means an element programmable or not for performing a logic operation.

While referring to the figures, the programmable gate array according to the invention and described hereinunder generally referred to as 1, is of the FPGA type and includes reconfigurable switch boxes 2 (the word "reconfigurable" being used herein as programmable) and reconfigurable logic units 3 connected together through a communication meshing such that:

each switch box 2 is directly connected to four neighboring switch boxes 2, each logic units 3 has eight neighboring logic units 3 and is connected to each of them through a switch box 2. The switch boxes 2 positioned at the edge of the array are connected to communication members with the outside of the array.

Each switch box 2 includes input ports from the switch boxes I, output ports towards the switch boxes O, input ports from the logic units I', output ports towards the logic units O'.

Each input port from the switch boxes I has M inputs, each output ports towards the switch boxes O has M outputs, each input ports from the logic units I' has N inputs, each output port towards the logic units O' has P outputs.

Each switch box 2 includes four input ports I1, I2, I3, I4 respectively connected to the four neighboring switch box 2 and four output ports O1, O2, O3, O4 respectively connected to such four neighboring switch boxes 2. The ports I and O may include several inputs and outputs respectively, 32 in the present case (all are not represented in the figures not to overfill them), and are positioned on opposite sides of the switch box 2 which is shown with an octagonal shape.

Each switch box 2 also includes input ports I'1, I'2, I'3, I'4 and output ports O'1 O'2, O'3, O'4 connected to the four logic units surrounding it. The ports O' and I' may include several outputs and several inputs respectively 4 and 16 in the present case, and are positioned on either side of the switch box 2.

Each switch box 2 includes M first routing elements 4, N second routing elements 5 and P third routing elements 6.

Each input port I is connected to all the output ports O by means of the programmable routing elements 4. There are 32 routing elements 4 here, distributed in pairs and each has four inputs connected each to one of the inputs of the ports I and four outputs connected each to one of the outputs of the ports O.

Each input port I' is connected to all the output ports O' through the programmable routing elements 5 connected to the programmable routing elements 6. There are 4 routing elements 5, which have four inputs and four outputs. There are 16 routing elements 6 distributed into four groups and which have three inputs and four outputs. The four inputs of each routing element 5 are connected each to one of the input ports I' and the four outputs of each routing element 5 are connected each, on the one hand, to one input of each of the routing elements 4 of a pair and on the other hand to one of the three inputs of each of the routing elements 6 of an associated group. The two other inputs of the routing elements 6 are connected to the output of two routing elements 4 and the outputs of each of the routing elements 6 are connected each to one of the inputs of each output port O'. Each input port I' is connected to all the output ports O through the routing elements 4 and 5.

Figure 2:
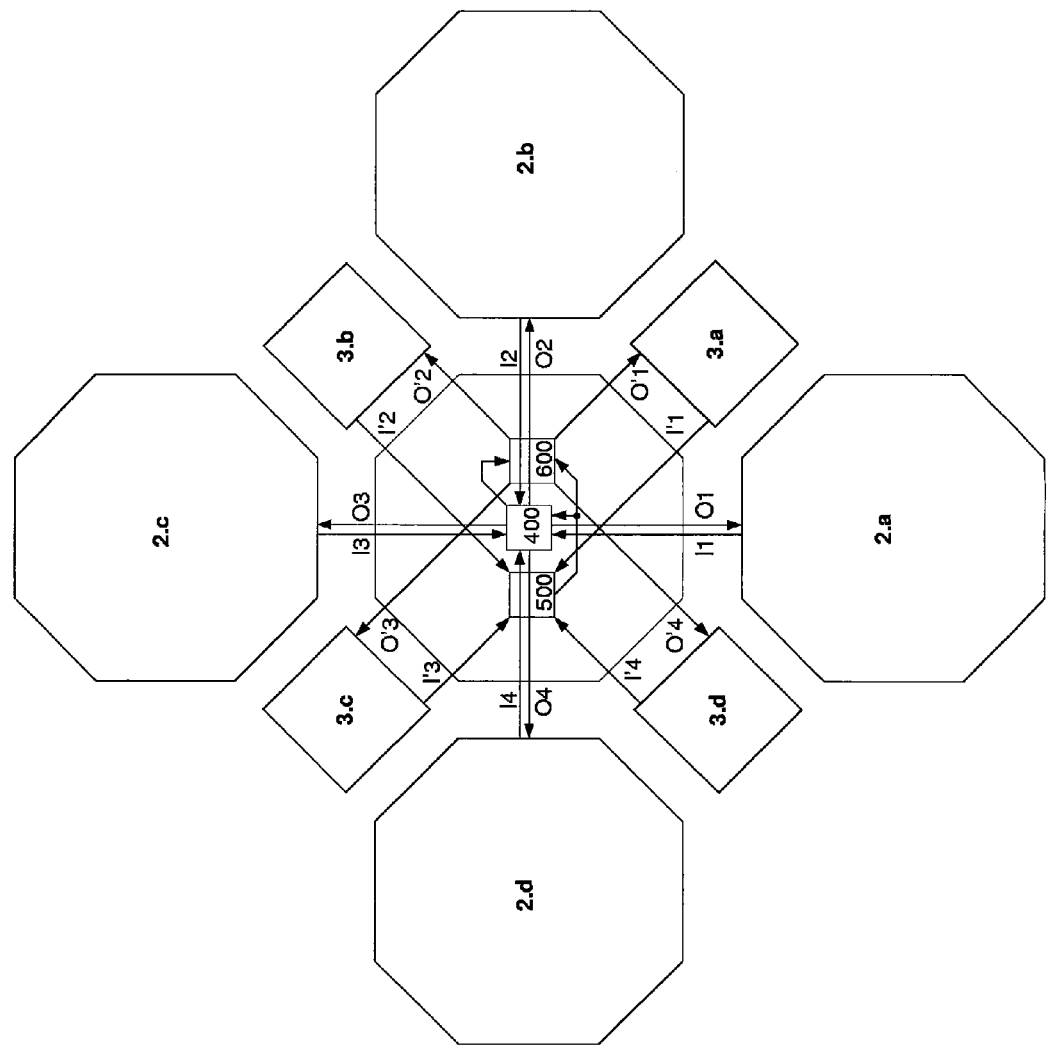
FIG. 2 is an enlarged schematic view of the area II of FIG. 1.

Each input port I is also connected to all the output ports O' through the routing units 4 and 6. The references 400, 500 and 600 mentioned in FIG. 2 refer to the assembly of the routing elements 4, 5 and 6 respectively. It should be noted that:

the switch boxes 2 communicate together via the routing elements 4 and with the neighboring logic units 3 through the routing elements 4 and 6;

the logic units 3 communicate with the neighboring logic units via the routing elements 5 and the routing elements 6 of the neighboring switch boxes (each of the neighboring switch boxes of a logic unit allows this logic unit to be connected to three other logic units which such switch box is connected to, without going through another switch box).

Each logic unit 3 includes programmable clusters 7 for performing elementary logic functions. Each logic unit 3 has a hierarchical structure which has several hierarchy levels and which results in a duplication of groups. Group $G_1$ with the lowest level is called the first level and includes $R_1$ input and $S_1$ outputs with at least:

$Q_1$ clusters 7 each having i inputs and j outputs, a first level routing assembly.

The first level routing assembly includes:

i incoming routing elements 8 each connected to all the clusters of the first level group thereof and each including $y_1$ external inputs of such group, j outgoing routing elements 9 connected to all the clusters 7 of the first level group thereof and to all the incoming routing elements 8 of such group.

The group $G_2$ having a second level includes x first level groups and have a second level routing assembly. The second level routing assembly is in fact composed of $y_1$ routing sub-assemblies of the same type as the first level routing assemblies and including the same numbers of incoming and outgoing routing elements (the incoming and outgoing routing elements of the second level routing assembly are numbered 10 and 11).

Thus, this second hierarchical level routing assembly includes:
- $R_1$ incoming routing elements 10 each connected to one of the incoming routing element 8 of the first level of each first level group and to one of the input ports,
- $S_1$ outgoing routing elements 11 connected each to one of the first level outgoing routing elements 9 of each first level group $G_1$, to one part of the second level incoming routing elements 10 and to one of the output ports.

It should be noted that the group $G_{n+1}$ having a hierarchical level n+1 includes groups $G_n$ having a hierarchical level n and a level n+1 routing assembly which is connected to the level n routing assemblies and which includes $y_n$ routing sub-assemblies of the same type as the level n routing assemblies.

There are 16 clusters 7, grouped in four first level groups of 4 clusters 7 and have each six inputs and two outputs. Each first level group includes:
- six first level incoming routing elements 8 having four outputs connected each to an input of all the clusters 7 of the first level group thereof,
- two first level outgoing routing elements 9 having four inputs each connected to the output of each of the clusters 7 of the first level group thereof, and three outputs connected each to an input of all the first level incoming routing elements 8 of this group.

The second level group integrates the four first level groups and the second level routing assembly which includes three routing sub-assemblies identical with the first level routing assemblies, each including:
- six second level incoming routing elements 10 having each four outputs connected each to one input of one of the first level incoming routing elements 8 of each first level group and two external inputs connected each to the output ports O' of the switch boxes 2 which are adjacent to the logic unit 3 considered,
- two second level outgoing routing 11 having four inputs connected each to one output of one of the first level outgoing routing elements 9 of each first level group, and three outputs connected, on the one hand, to one input of each of the second level incoming routing elements 10 of the routing assembly concerned and, on the other hand, to the input ports I' of the adjacent switch boxes 2.

Figure 3:
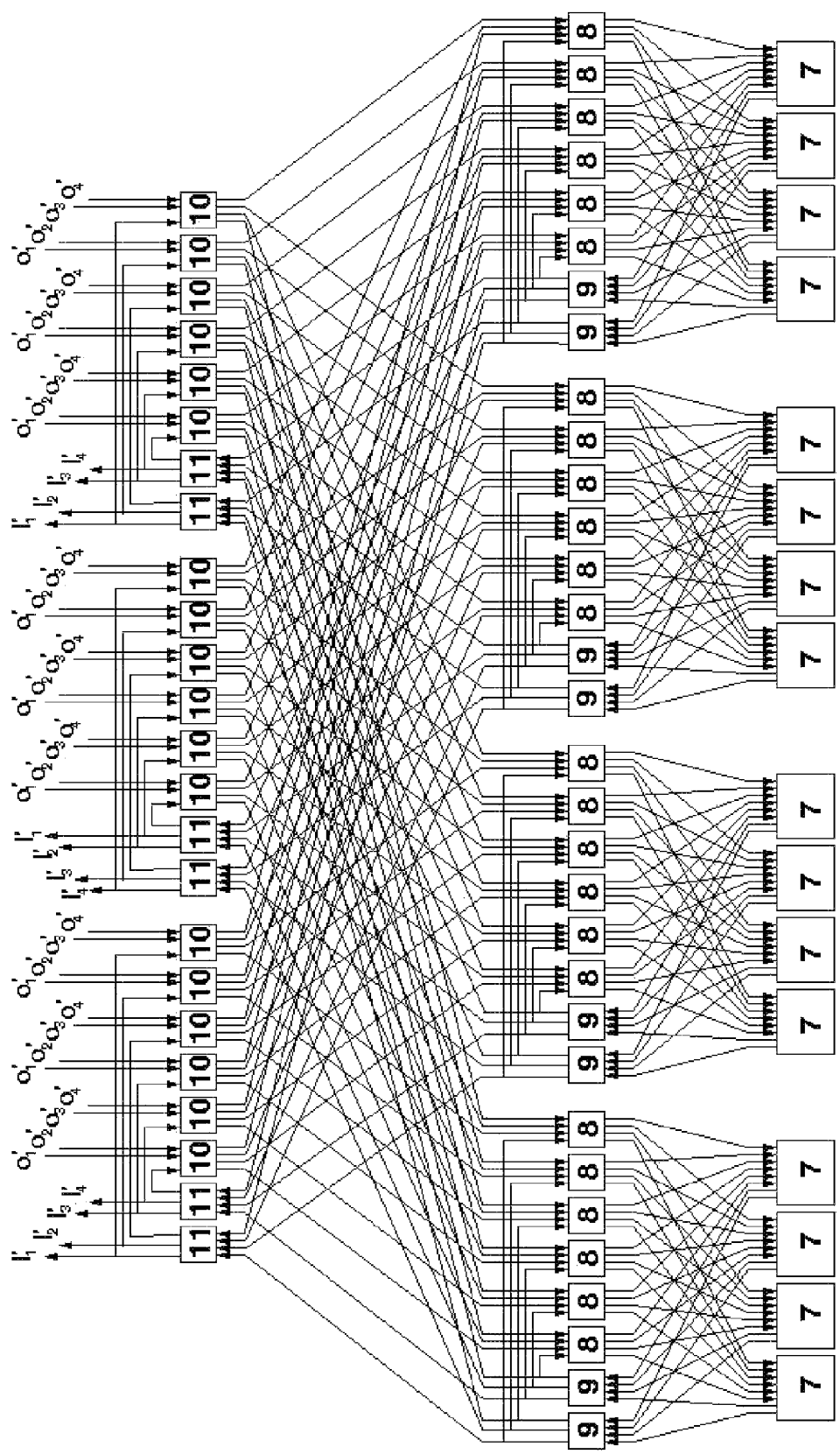
FIG. 3 is a detailed schematic view of a configurable logic unit in this array.
Figure 4:
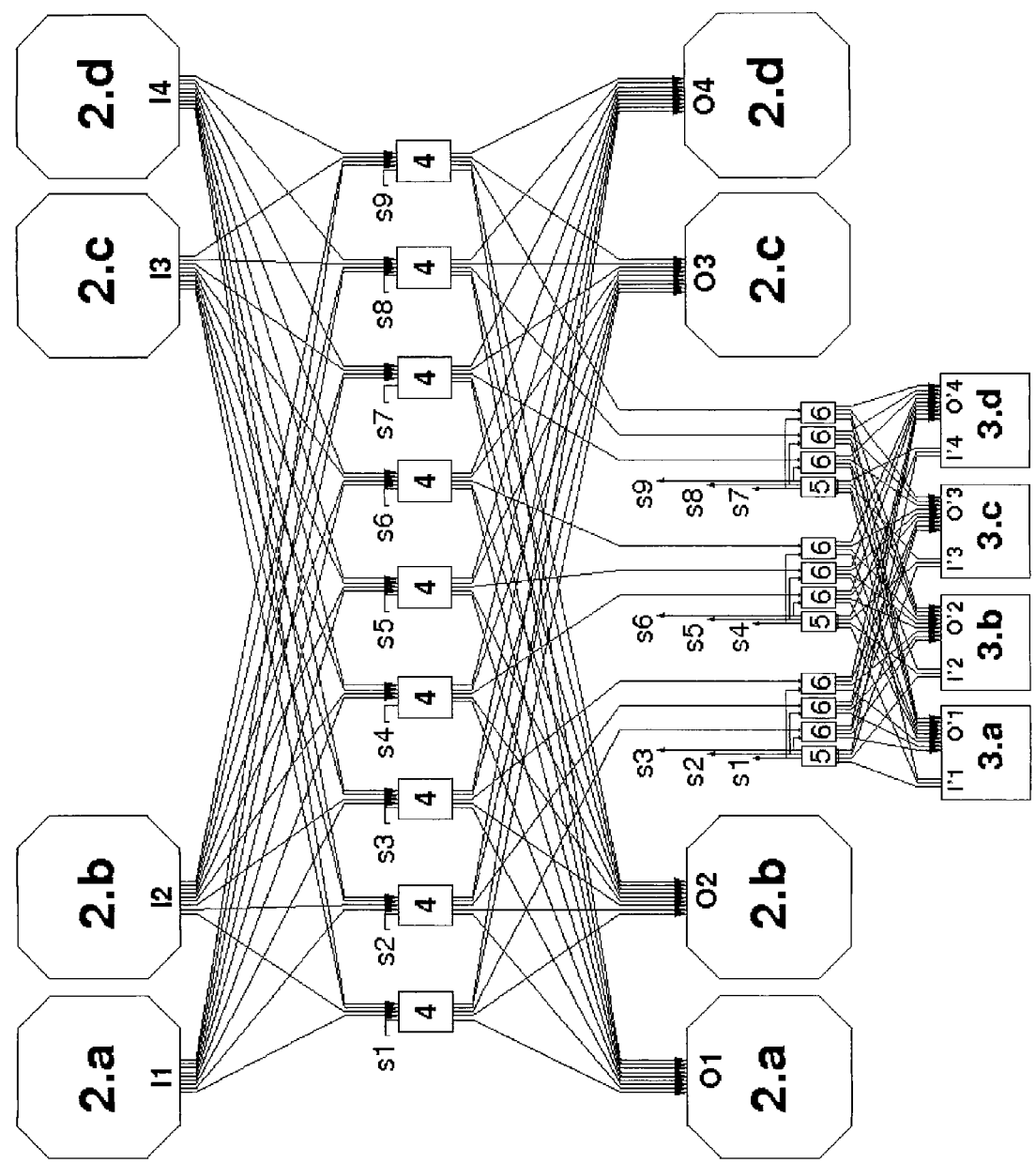
FIG. 4 is a detailed schematic view of a switch box of this array.

FIG. 3 thus shows a second level group having four first level groups.

Switch boxes 2 and logic units 3 have thus a tree structure according to which it is possible to connect two points on the array by a single path while going upstream or downstream the tree structure. This makes it possible to have a good estimation of the routing times.

The manufacturing of the integrated circuits making the programmable logics arrays is not the subject of the present invention. This is true for the principles of programming the clusters 7, the routing units 4, 5, 6, the routing elements 8, 9, 10, 11 and the switch boxes 2 which are known per se, and are thus not described herein.

Of course, the invention is not limited to the embodiment described but encompasses any alternative solution within the scope of the invention, such as described in the appended claims.

The logic unit described includes first level (or lower level) groups and one second level (or upper level) group. In the logic unit, it is possible to have more than two levels and for example intermediary level groups between the lower level group and the upper level group.

In the logic unit, it is possible to have a meshed architecture.

The number of inputs and outputs in the ports, the routing units and the clusters as well as their distribution in pairs or in groups can be modified. Thus, the number n of logic elements which is 16, in the embodiment described, can be different and for example 8, 12, or 32.

In a less efficient solution, the array according to the invention is built from switch boxes and/or logic units having structures different from those described hereabove.

Such architecture can be implemented for embedded FPGA applications or on a stand alone circuit.

The invention claimed is:

1. A switch box (2) for a programmable gate array, including input ports grouping a plurality of inputs (I, I') and output ports grouping a plurality of outputs (O, O'), characterized in that the inputs and the outputs are connected to a downstream connection tree structure from the inputs to the outputs and including routing elements (4, 5, 6) organized on several levels to connect by a single path each input of all the input ports to at least one output of each output port.

2. A switch box (2) according to claim 1, wherein:
the output ports include output ports toward neighboring switch boxes (O) and output ports toward neighboring logic units (O'),
the input ports include input ports from neighboring switch boxes (I) and input ports from the neighboring logic units (I'),
the routing elements include first routing elements (4) positioned between the input ports from the neighboring switch boxes and the output ports toward the neighboring switch boxes; second routing elements (5) positioned between, on the one hand, the input ports from the logic units and, on the other hand, the first routing elements and third routing elements, the third routing elements (6) being positioned between, on the one hand, the first routing elements and the second routing elements and, on the other hand, the output ports toward the logic units.

3. A switch box according to claim 2, wherein:
the first routing elements (4) have inputs connected each to one input of each input port from the neighboring switch boxes (I), at least one input connected to one output of one of the second routing elements (5), outputs connected each to an output of each output port toward the neighboring switch boxes (O) and outputs connected each to one input of one of the third routing elements (6);
the second routing elements (5) have inputs connected each to one of the inputs of each input port from the logic units (I') and outputs connected each to the corresponding input of a part of the first routing elements and to one of the inputs of a part of the third routing elements;
the third routing elements have inputs connected to the outputs of the first and second routing elements and outputs connected each to one of the outputs of each output port to the logic units (O').

4. A switch box according to claim 3, wherein each input port from the switch boxes (I) has M inputs, each output port to the switch boxes (O) has M outputs, each input port from the logic units (I') has N inputs, each output port to the logic units (O') has P outputs and wherein there are M first routing elements (4), there are N second routing elements (5) and there are P third routing elements (6).

5. A logic unit (3) for a programmable gate array, including clusters (7) connected to input ports grouping a plurality of input and output ports grouping a plurality of outputs, characterized in that the inputs, the outputs and the clusters are connected to a downstream connection tree structure from the input ports toward the clusters and upstream from the clusters toward the upper ports and including incoming routing elements (8, 9) and outgoing routing elements (10, 11) organized on several levels, the incoming routing elements connecting by a single path each input of all the input ports to all the clusters and the outgoing routing elements connecting by a single path each output of a cluster to all the output ports and to the incoming routing elements of the same group.

6. A logic unit according to claim 5, wherein each logic unit (3) has L hierarchical levels which each include at least one group $G_n$ grouping at least:

$R_n$ inputs and $S_n$ outputs, $Q_n$ groups $G_{n-1}$ belonging to the hierarchical level n−1, each having $R_{n-1}$ inputs and $S_{n-1}$ outputs, $R_{n-1}$ incoming routing elements (8) each connected to all the $Q_n$ groups $G_{n-1}$, $S_{n-1}$ outgoing routing elements (9) connected to all the $Q_n$ groups $G_{n-1}$ and to an assembly of the incoming routing elements of such group, each group having the lowest level corresponding to a cluster.

7. A programmable gate array including reconfigurable switch boxes (2) and reconfigurable logic units (3) connected together through a communication machine such that:

each switch box is directly connected to four neighboring switch boxes and includes input ports grouping; a plurality of inputs (I, I') and output ports grouping a plurality of outputs (O, O'), the inputs and the outputs are connected to a downstream connection tree structure from the inputs to the outputs and including, routing elements (4, 5, 6) organized on several levels to connect by a single path each input of all the input ports to at least one output of each output port, each logic unit has eight neighboring logic units and is connected to each one through a switch box, at least one single path is defined between two points on the array.

8. An array according to claim 7, wherein:

the output ports include output ports toward neighboring switch boxes (O) and output ports toward neighboring logic units (O'), the input ports include input ports from neighboring switch boxes (I) and input ports from the neighboring logic units (I'), the routing elements include first routing elements (4) positioned between the input ports from the neighboring switch boxes and the output ports toward the neighboring switch boxes; second routing elements (5) positioned between, on the one hand, the input ports from the logic units and, on the other hand, the first routing elements and third routing elements, the third routing elements (6) being positioned between, on the one hand, the first routing elements and the second routing elements and, on the other hand, the output ports toward the logic units.

9. An array according to claim 8, wherein:

the first routing elements (4) have inputs connected each to one input of each input port from the neighboring switch boxes (I), at least one input connected to one output of one of the second routing elements (5), outputs connected each to an output of each output port toward the neighboring switch boxes (O) and outputs connected each to one input of one of the third routing elements (6);

the second routing elements (5) have inputs connected each to one of the inputs of each input port from the logic units (I') and outputs connected each to the corresponding input of a part of the first routing elements and to one of the inputs of a part of the third routing elements;

the third routing elements have inputs connected to the outputs of the first and second routing elements and outputs connected each to one of the outputs of each output port to the logic units (O').

10. An array according to claim 9, wherein each input port from the switch boxes (I) has M inputs, each output port to the switch boxes (O) has M outputs, each input port from the logic units (I') has N inputs, each output port to the logic units (O') has P outputs and wherein there are M first routing elements (4), there are N second routing elements (5) and there are P third routing elements (6).

11. A programmable gate array including reconfigurable switch boxes (2) and reconfigurable logic units (3) connected together through a communication machine such that:

each switch box is directly connected to four neighboring switch boxes, each logic unit has eight neighboring logic units and is connected to each one through a switch box and each logic unit includes clusters (7) connected to input ports grouping a plurality of input and output ports grouping a plurality of outputs, wherein the inputs, the outputs and the clusters are connected to a downstream connection tree structure from the input ports toward the clusters and upstream from the clusters toward the upper ports and including incoming routing elements (8, 9) and outgoing routing elements (10, 11) organized on several levels, the incoming routing elements connecting by a single path each input of all the input ports to all the clusters and the outgoing routing elements connecting by a single path each output of a cluster to all the output ports and to the incoming routing elements of the same group, at least one single path is defined between two points on the array.

12. An array according to claim 7, wherein the logic units include clusters (7) connected to input ports grouping a plurality of input and output ports grouping a plurality of outputs, characterized in that the inputs, the outputs and the clusters are connected to a downstream connection tree structure from the input ports toward the clusters and upstream from the clusters toward the upper ports and including incoming routing elements (8, 9) and outgoing routing elements (10, 11) organized on several levels, the incoming routing elements connecting by a single path each input of all the input ports to all the clusters and the outgoing routing elements connecting by a single path each output of a cluster to all the output ports and to the incoming routing elements of the same group.

13. The array according to claim 12, wherein each logic unit (3) has L hierarchical levels which each include at least one group $G_n$ grouping at least:

$R_n$ inputs and $S_n$ outputs, $Q_n$ groups $G_{n-1}$ belonging to the hierarchical level n−1, each having $R_{n-1}$ inputs and $S_{n-1}$ outputs, $R_{n-1}$ incoming routing elements (8) each connected to all the $Q_n$ groups $G_{n-1}$, $S_{n-1}$ outgoing routing elements (9) connected to all the $Q_n$ groups $G_{n-1}$ and to an assembly of the incoming routing elements of such group, each group having the lowest level corresponding to a cluster.

14. The array according to claim 11, wherein each logic unit (3) has L hierarchical levels which each include at least one group $G_n$ grouping at least:
  $R_n$ inputs and $S_n$ outputs,
  $Q_n$ groups $G_{n-1}$ belonging to the hierarchical level n−1, each having $R_{n-1}$ inputs and $S_{n-1}$ outputs,
  $R_{n-1}$ incoming routing elements (8) each connected to all the $Q_n$ groups $G_{n-1}$,
  $S_{n-1}$ outgoing routing elements (9) connected to all the $Q_n$ groups $G_{n-1}$ and to an assembly of the incoming routing elements of such group,
  each group having the lowest level corresponding to a cluster.

* * * * *